(12) United States Patent
Kim et al.

(10) Patent No.: US 10,775,666 B2
(45) Date of Patent: Sep. 15, 2020

(54) DISPLAY DEVICE

(71) Applicant: Samsung Display Co., Ltd., Yongin-si, Gyeonggi-do (KR)

(72) Inventors: Jang-Il Kim, Asan-si (KR); Yeo Geon Yoon, Suwon-si (KR); Keun Woo Park, Incheon (KR); Su Wan Woo, Suwon-si (KR); Kee-Bum Park, Cheonan-si (KR); Do Yeong Park, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 273 days.

(21) Appl. No.: 15/868,768

(22) Filed: Jan. 11, 2018

(65) Prior Publication Data

US 2018/0356677 A1    Dec. 13, 2018

(30) Foreign Application Priority Data

Jun. 7, 2017 (KR) .................. 10-2017-0070835

(51) Int. Cl.
*G02F 1/1335* (2006.01)
*G02F 1/13357* (2006.01)
(Continued)

(52) U.S. Cl.
CPC ...... *G02F 1/133514* (2013.01); *G02F 1/1368* (2013.01); *G02F 1/133617* (2013.01); *G02F 1/136209* (2013.01); *G02F 1/136286* (2013.01); *H01L 27/124* (2013.01); *H01L 27/1222* (2013.01); *H01L 27/1248* (2013.01); *H01L 29/78609* (2013.01); *H01L 29/78669* (2013.01);
(Continued)

(58) Field of Classification Search
CPC .......... G02B 5/20; G02B 5/223; G02B 6/026; G02F 1/1336; G02F 1/133602; G02F 1/133603; G02F 1/13362; G02F 1/133621
See application file for complete search history.

(56) References Cited

U.S. PATENT DOCUMENTS 6,693,697 B2 * 2/2004 Sakamoto ......... G02F 1/136209
349/106
9,455,414 B2 9/2016 Shu et al.
(Continued)

FOREIGN PATENT DOCUMENTS

KR         100961948 B1 *  6/2010
KR     10-2015-0084578 A   7/2015
KR     10-2016-0107376 A   9/2016

*Primary Examiner* — Robert E. Tallman
(74) *Attorney, Agent, or Firm* — Innovation Counsel LLP

(57) ABSTRACT

An exemplary embodiment of the present inventive concept provides a display device including: a light unit configured to emit blue light; a color conversion panel disposed on the light unit; and a display panel disposed between the light unit and the color conversion panel to include a transistor. The color conversion panel includes: a substrate; a color conversion layer disposed between the substrate and the display panel to include a semiconductor nanocrystal; a transmission layer disposed between the substrate and the display panel; and a polarization layer disposed between the color conversion layer and the display panel and between the transmission layer and the display panel, and the display panel includes a blue light blocking film which overlaps the transistor, while the blue light blocking film includes a red color filter.

20 Claims, 7 Drawing Sheets

(51) Int. Cl.
*G02F 1/1368* (2006.01)
*G02F 1/1362* (2006.01)
*H01L 27/12* (2006.01)
*H01L 29/786* (2006.01)
*G02F 1/1339* (2006.01)

(52) U.S. Cl.
CPC .... *G02F 1/13394* (2013.01); *G02F 1/133528* (2013.01); *G02F 2001/136222* (2013.01); *G02F 2202/36* (2013.01)

(56) References Cited

U.S. PATENT DOCUMENTS

| | | | |
|---|---|---|---|
| 2013/0215507 A1* | 8/2013 | Sasaki | G02B 5/3058 359/485.05 |
| 2016/0070136 A1* | 3/2016 | Jang | G02F 1/133514 349/61 |
| 2019/0018287 A1* | 1/2019 | Luchinger | G02F 1/133514 |

* cited by examiner

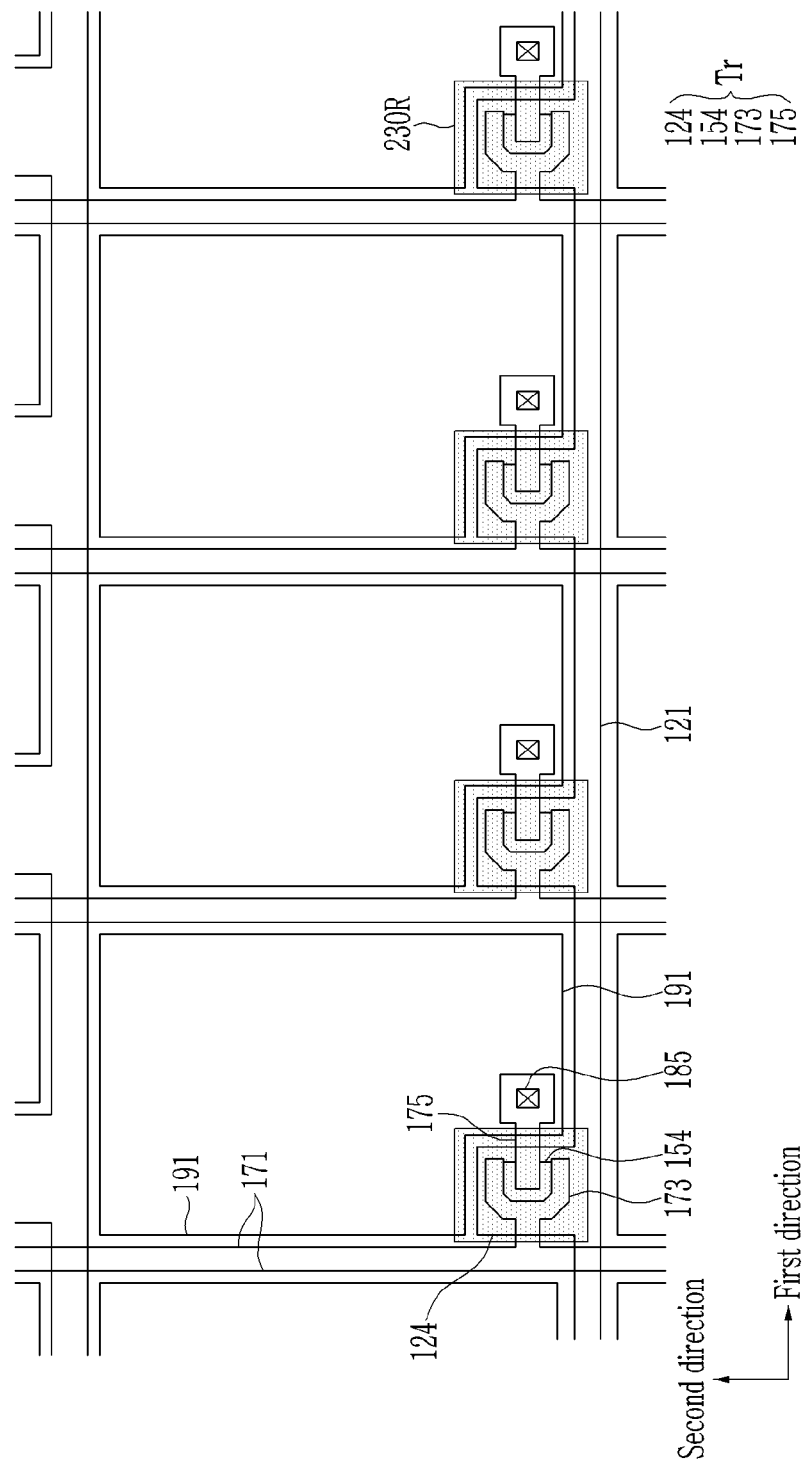

DISPLAY DEVICE

CROSS-REFERENCE TO RELATED APPLICATION

This application claims priority to and the benefit of Korean Patent Application No. 10-2017-0070835 filed in the Korean Intellectual Property Office on Jun. 7, 2017, the entire contents of which are incorporated herein by reference.

BACKGROUND

(a) Field

The present disclosure relates to a display device.

(b) Description of the Related Art

A liquid crystal display used as a display device may include two field generating electrodes, a liquid crystal layer, a color filter, and a polarization layer. Light leakage may be generated in a color filter and a polarization layer of the display device. A display device including a color conversion display plate has been proposed in order to reduce a loss of light and to realize a display device having a high color reproduction rate. The above information disclosed in this Background section is only for enhancement of understanding of the background of the invention and therefore it may contain information that does not form the prior art that is already known in this country to a person of ordinary skill in the art.

SUMMARY

Exemplary embodiments have been made in an effort to prevent performance deterioration of a transistor caused by blue light. An exemplary embodiment of the present inventive concept provides a display device including: a light unit configured to emit blue light; a color conversion panel disposed on the light unit; and a display panel disposed between the light unit and the color conversion panel to include a transistor. The color conversion panel includes: a substrate; a color conversion layer disposed between the substrate and the display panel to include a semiconductor nanocrystal; a transmission layer disposed between the substrate and the display panel; and a polarization layer disposed between the color conversion layer and the display panel and between the transmission layer and the display panel. The display panel includes a blue light blocking film which overlaps the transistor, and the blue light blocking film includes a red color filter. The polarization layer may include: a first layer including an inorganic material; a second layer including a metal material; and a third layer including an inorganic material. The display panel may include a display area and a non-display area disposed around the display area, the transistor may be disposed in at least one of the display area and the non-display area, and the blue light blocking film may be disposed in at least one of the display area and the non-display area. The display panel may further include: a gate line extending in a first direction; and a data line extending in a second direction that is perpendicular to the first direction, and the transistor may be connected to the gate line and the data line, while the blue light blocking film may extend in the first direction. The blue light blocking film may have an island-like shape. The blue light blocking film may include a plurality of blue blocking films, and the blue light blocking films may be separated along the first direction. The display panel may further include a column spacer, and the column spacer may overlap the blue light blocking film. The light unit may include a blue light emitting diode (LED). An exemplary embodiment of the present inventive concept provides a display device including: a light unit; a color conversion panel disposed on the light unit; and a display panel disposed between the light unit and the color conversion panel to include a transistor. The color conversion panel includes: a substrate; a color conversion layer disposed between the substrate and the display panel to include a semiconductor nanocrystal; a transmission layer disposed between the substrate and the display panel; and a polarization layer disposed between the color conversion layer and the display panel and between the transmission layer and the display panel. The display panel includes a blue light blocking film which overlaps the transistor, the light unit is configured to emit light having a first wavelength that is in a range of about 400 nm to 500 nm, and the blue light blocking film is configured to absorb the light having the first wavelength. According to the exemplary embodiments, it is possible to prevent performance deterioration of a transistor caused by blue light.

BRIEF DESCRIPTION OF THE DRAWINGS

FIG. 7 is a top plan view illustrating a plurality of pixels according to an exemplary embodiment of the present inventive concept.

DETAILED DESCRIPTION OF THE EMBODIMENTS

Figure 1:
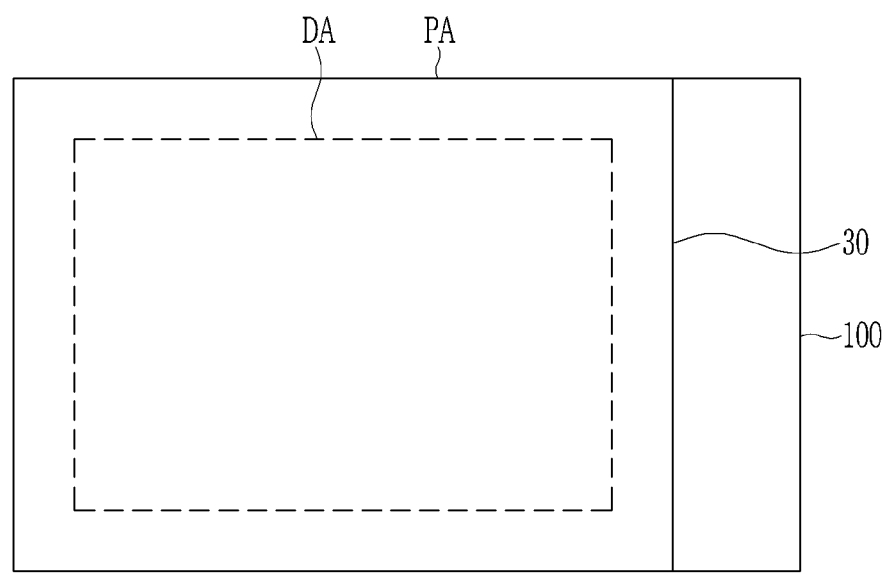
FIG. 1 is a top plan view illustrating a display device according to an exemplary embodiment of the present inventive concept.

The present inventive concept will be described more fully hereinafter with reference to the accompanying drawings, in which exemplary embodiments of the invention are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Figure 2:
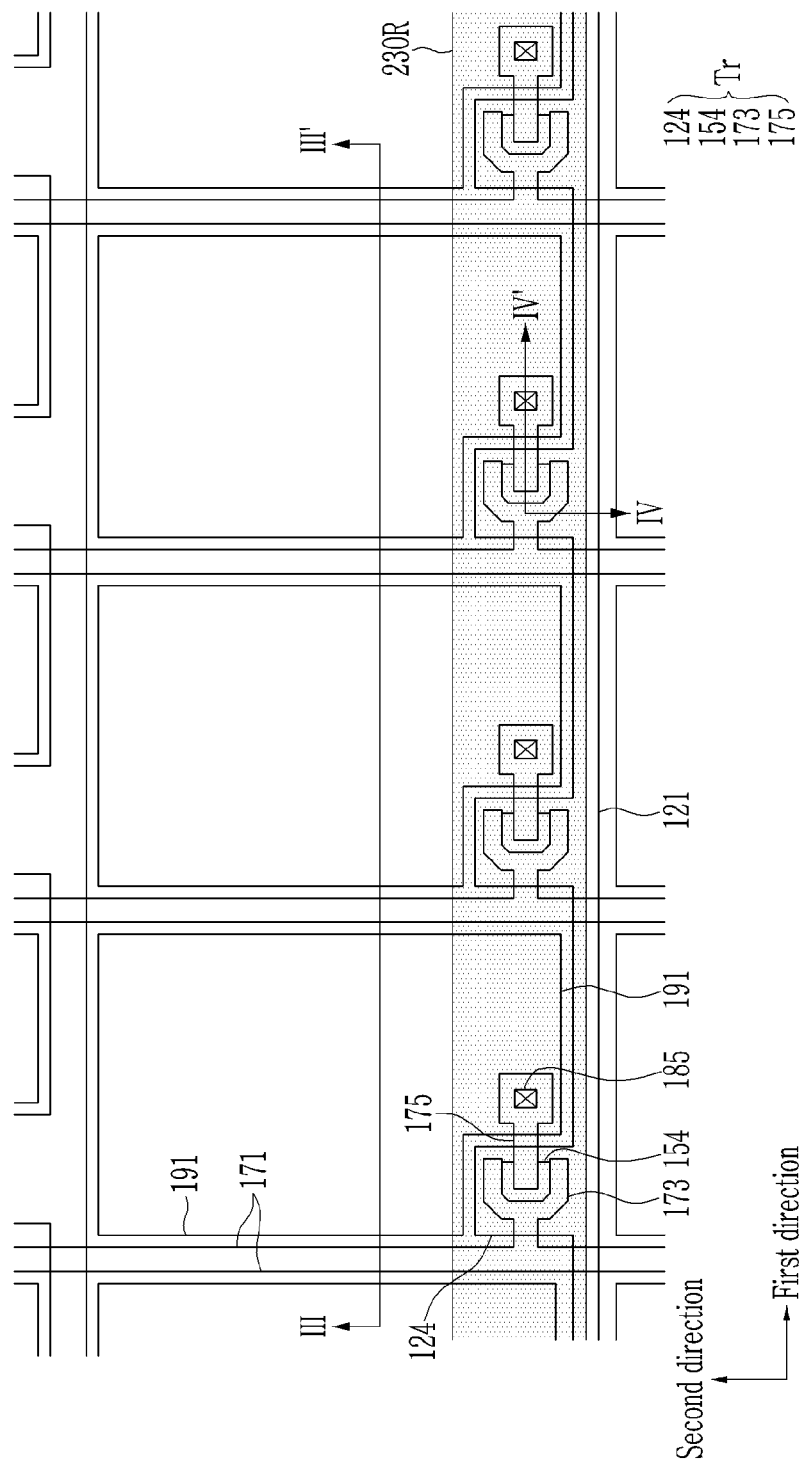
FIG. 2 is a top plan view illustrating a plurality of pixels positioned in a display area according to an exemplary embodiment of the present inventive concept.
Figure 3:
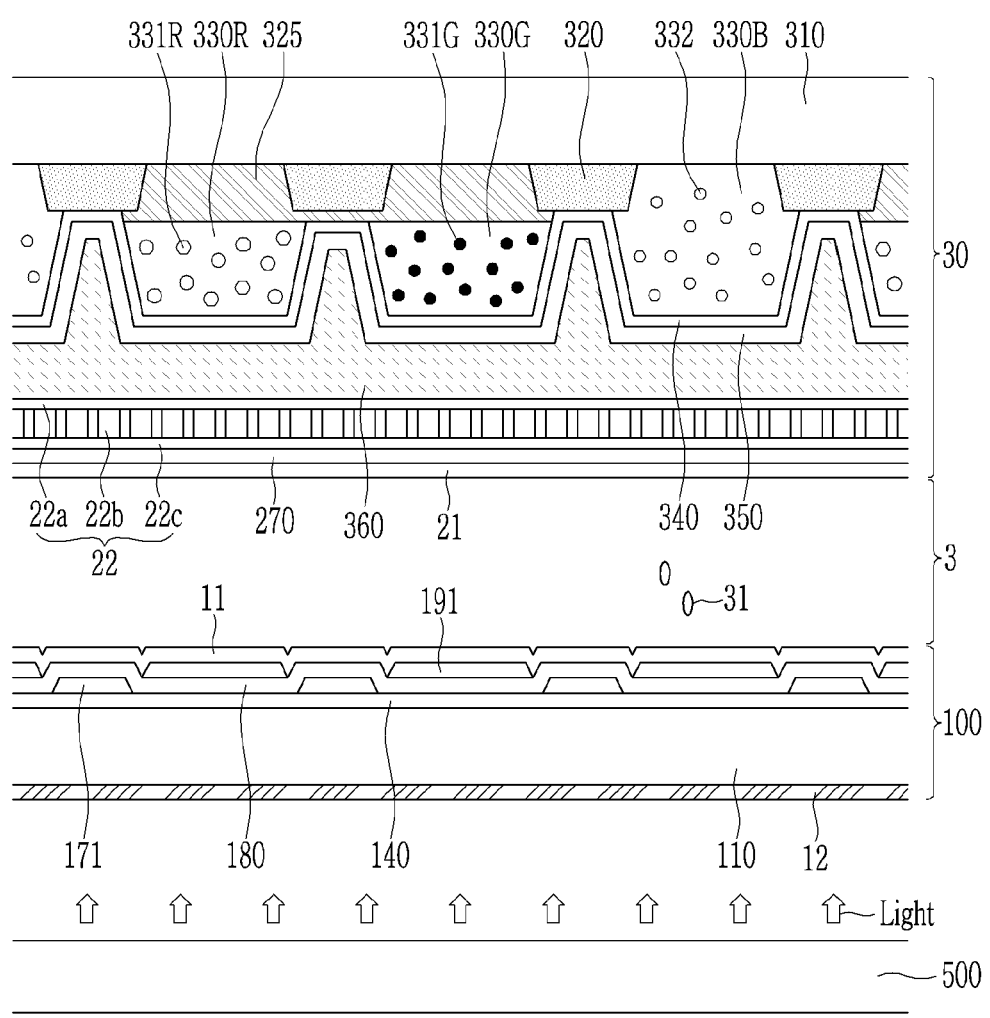
FIG. 3 is a cross-sectional view taken along a line III-III' of FIG. 2.
Figure 4:
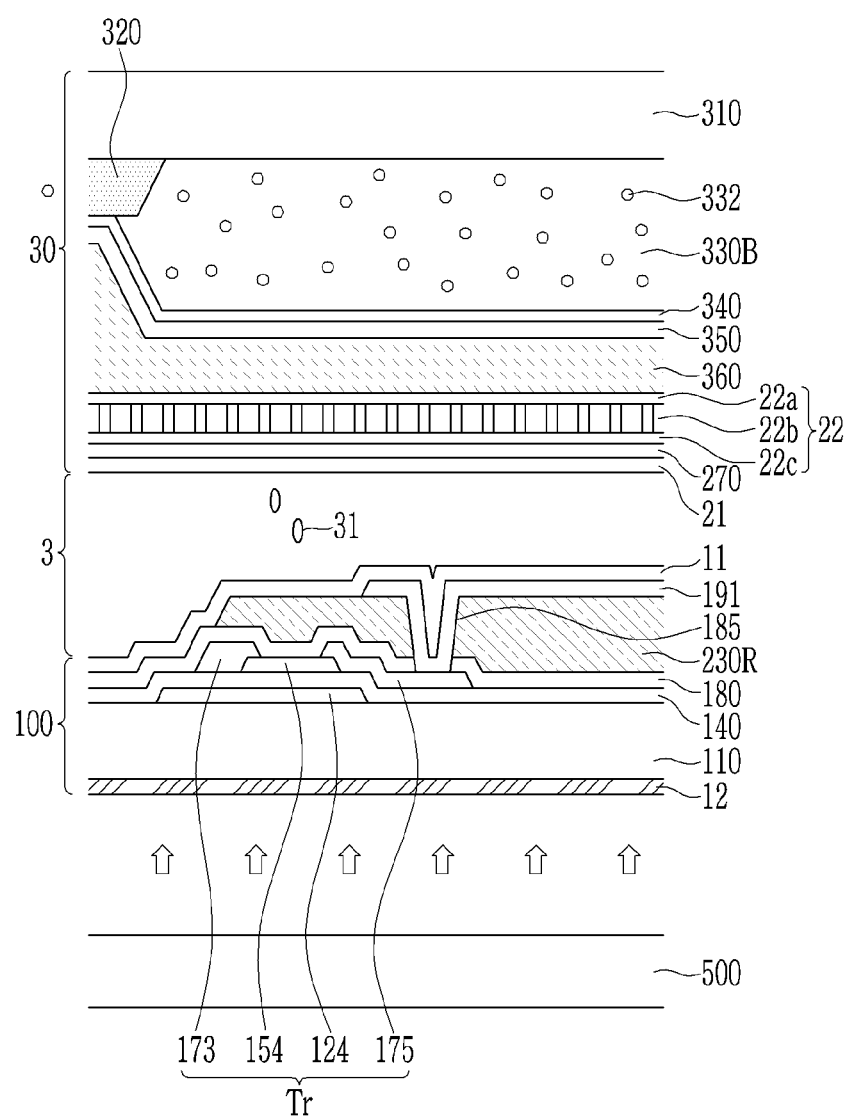
FIG. 4 is a cross-sectional view taken along a line IV-IV' of FIG. 2.

Hereinafter, a display device according to an exemplary embodiment will be described with reference to FIG. 1 to FIG. 4. FIG. 1 is a top plan view illustrating a display device according to an exemplary embodiment of the present inventive concept, FIG. 2 is a top plan view illustrating a plurality of pixels positioned in a display area according to an exemplary embodiment of the present inventive concept, FIG. 3 is a cross-sectional view taken along a line III-III' of FIG. 2, and FIG. 4 is a cross-sectional view taken along a line IV-IV' of FIG. 2.

Referring to FIG. 1, the display device according to an exemplary embodiment of the present inventive concept may be manufactured in a form in which a display panel 100 and a color conversion panel 30 are attached together, and may include a display area DA and a non-display area PA. As shown in FIG. 1, the display area DA may represent an inner portion of a quadrangle, and the non-display area PA may represent an outer portion of the quadrangle indicated by the dotted line. The display area DA may serve to output an actual image, and a pad unit or a driver (not illustrated) may be disposed in the non-display area PA.

A plurality of pixels arranged in a matrix form may be disposed in the display area DA, and each of the pixels may include a transistor. The transistor may also be disposed in the non-display area PA. In this case, the transistor may be a dummy transistor and/or a transistor of a driver. The transistor disposed in the non-display area PA may be formed by using a same process as that of the transistor disposed in the display area DA for convenience of the process. Hereinafter, the display area DA of the display panel 100 will be described. However, the present inventive concept is not limited thereto. This is also true of the non-display area PA.

The display device according to the present exemplary embodiment includes a blue light blocking film that overlaps the transistor. According to an exemplary embodiment, the blue light blocking film may overlap at least one of the transistors disposed in the display area DA and the non-display area PA. This will be described in detail hereinafter.

Referring to FIG. 2 and FIG. 3, the display device includes a light unit 500, the display panel 100, the color conversion panel 30, and a liquid crystal layer 3.

The light unit 500 may include a light source for generating light having a first wavelength, and a light guide (not illustrated) for receiving light generated from the light source and guiding the received light toward the display panel 100 and the color conversion panel 30. The first wavelength may be in a range of about 400 nm to 500 nm to indicate a blue color.

For example, the light unit 500 may include a light source for emitting blue light. The light unit 500 may include any light source that emits blue light, e.g., a blue light emitting diode (LED).

The display panel 100 and the color conversion panel 30 overlap each other, and the liquid crystal layer 3 including liquid crystal molecules 31 is disposed therebetween.

According to the present exemplary embodiment, the display device may include a first polarization layer 12 disposed on one side of, e.g., the bottom side of, the display panel 100. The first polarization layer 12 may linearly polarize the light generated in the light unit 500.

The first polarization layer 12 may include a coated polarization layer, a wire grid polarizer, or the like. The first polarization layer 12 may be disposed on one side of a first substrate 110 in various forms such as a film form, a coating form, an attachment form, and a printing form. However, this is merely an example, and is not limited thereto.

The first substrate 110 is disposed under a gate line 121 extended in a first direction and including a gate electrode 124, a gate insulating layer 140 disposed on the gate line 121, and a semiconductor layer 154 disposed on the gate insulating layer 140. The semiconductor layer 154 may include an amorphous semiconductor material. Next, a data line 171 is disposed on the gate insulating layer 140 to extend in a second direction and to include a source electrode 173, a drain electrode 175 is disposed at a same layer as the source electrode 173, and a passivation layer 180 is disposed on the data line 171 and the drain electrode 175.

The semiconductor layer 154 disposed on the gate electrode 124 may include a channel layer disposed between the source electrode 173 and the drain electrode 175, and the gate electrode 124, the semiconductor layer 154, the source electrode 173, and the drain electrode 175 constitute one transistor Tr.

According to the present exemplary embodiment, a blue light blocking film 230R is disposed on the passivation layer 180. The blue light blocking film 230R may be formed of any material that absorbs blue light, and may be a red color filter, for example. A typical light blocking member has a black color, and it is not easy to inspect the transistor during a manufacturing process of the display device. However, according to an exemplary embodiment, when the blue light blocking film 230R is formed of the red color filter, a position of the transistor may be easily identified in the manufacturing process of the display device, simplifying the inspecting process.

The blue light blocking film 230R may absorb light having a first wavelength that is in a range of about 400 to 500 nm. According to the present exemplary embodiment, the light unit 500 may emit light having the first wavelength, and the blue light blocking film 230R may directly absorb the emitted light and may absorb light reflected by a second polarization layer 22 to be described later. The blue light blocking film 230R may be formed of any material that absorbs such light.

The blue light blocking film 230R may extend in the first direction. The blue light blocking film 230R may have any shape to cover the transistor. For example, the blue light blocking film 230R may have a linear shape that extends in an extending direction of the gate line 121 as shown in FIG. 2. The blue light blocking film 230R may be disposed to cover the gate line 121, and may be disposed in parallel with the gate line 121.

The blue light blocking film 230R serves to prevent performance deterioration of the transistor caused by blue light that is reflected by the second polarization layer 22 and introduced into a channel layer of the transistor Tr. Some of the blue light emitted from the light unit 500 may be reflected by the second polarization layer 22 made of a metal material, and some of the reflected light may be introduced into the transistor. The introduced blue light may affect the channel layer to increase leakage current of the transistor. However, according to the present exemplary embodiment, in the case of including the blue light blocking film 230R, since the blue light blocking film 230R absorbs blue light introduced into the channel layer, it is possible to provide a display device capable of preventing a leakage current of the transistor and improving reliability.

Although not illustrated in this specification, an organic film disposed on the blue light blocking film 230R may be further included. The further included organic film may serve to reduce steps between constituent elements and facilitate bonding with different constituent elements.

A pixel electrode 191 is disposed on the blue light blocking film 230R and the passivation layer 180. The pixel electrode 191 is electrically connected to the drain electrode 175 through a contact hole 185 formed in the blue light blocking film 230R and the passivation layer 180.

The pixel electrode 191 may be arranged in a matrix form, and a shape and disposal of the pixel electrode 191 may be variously modified. A planar pixel electrode 191 is illustrated, but a slit pixel electrode may be included instead.

A first alignment layer 11 may be disposed on the pixel electrode 191.

The color conversion panel 30 overlaps the first substrate 110, and includes a substrate 310 that is separated therefrom. A light blocking member 320 may be disposed between the substrate 310 and the display panel 100.

The light blocking member 320 may be disposed between a first color conversion layer 330R and a second color conversion layer 330G, between a transmission layer 330B and the first color conversion layer 330R, and between the second color conversion layer 330G and the transmission layer 330B, adjacent to each other, and may define regions in which the first color conversion layer 330R, the second color conversion layer 330G, and the transmission layer 330B are disposed.

The light blocking member 320 may include a material that absorbs incident light or a material that reflects light. For example, the light blocking member 320 including a metal material may improve light efficiency by again reflecting light introduced from the first color conversion layer 330R, the second color conversion layer 330G, and the transmission layer 330B toward the first color conversion layer 330R, the second color conversion layer 330G, and the transmission layer 330B.

A blue light cutting filter 325 may be disposed between the light blocking member 320 and the display panel 100. The blue light cutting filter 325 is disposed only in regions that emit red light and green light, but is not disposed in a region that emits blue light.

As shown in FIG. 3, the blue light cutting filter 325 may be connected between a region that overlaps the first color conversion layer 330R and a region that overlaps the second color conversion layer 330G, but it is not limited thereto. For example, the blue light cutting filter 325 disposed in the region that overlaps the first color conversion layer 330R and the blue light cutting filter 325 disposed in the region that overlaps the second color conversion layer 330G may be separately formed.

The blue light cutting filter 325 may block or absorb blue light supplied from the light unit 500. Blue light introduced from the light unit 500 is converted into red or green light by a semiconductor nanocrystal. In this case, some of the blue light may be emitted through the substrate 310 without being converted. The blue light cutting filter 325 may have a single-layer structure or a stacked structure of a plurality of layers to prevent the emission of the blue light without the conversion.

The blue light cutting filter 325 may include any material for performing the above-mentioned effects, and may include a yellow color filter as an example.

The first color conversion layer 330R and the second color conversion layer 330G may be disposed between the blue light cutting filter 325 and the display panel 100, and the transmission layer 330B may be disposed between the substrate 310 and the display panel 100.

The first color conversion layer 330R may include a first semiconductor nanocrystal 331R, and the second color conversion layer 330G may include a second semiconductor nanocrystal 331G. Predetermined light introduced into the first color conversion layer 330R may be converted into red light by the first semiconductor nanocrystal 331R to be emitted from the first color conversion layer 330R. Predetermined light introduced into the second color conversion layer 330G may be converted into red light by the second color conversion layer 330G to be emitted from the second color conversion layer 330G.

The first semiconductor nanocrystal 331R includes at least one of a phosphor and a quantum dot for converting blue light into red light. The second semiconductor nanocrystal 331G includes at least one of a phosphor and a quantum dot for converting blue light into green light.

In this case, the quantum dot can be selected from a group II-VI compound, a group III-V compound, a group IV-VI compound, a group IV element, a group IV compound, and a combination thereof.

For the group II-VI compound, a binary compound selected from CdSe, CdTe, ZnS, ZnSe, ZnTe, ZnO, HgS, HgSe, HgTe, MgSe, MgS, and a mixture thereof; a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, may be employed. For the group III-V compound, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; or a quaternary compound selected from GaAlNAs, GaAlNSb, GaAlPAs, GaAlPSb, GaInNP, GaInNAs, GaInNSb, GaInPAs, GaInPSb, GaAlNP, InAlNP, InAlNAs, InAlNSb, InAlPAs, InAlPSb, and a mixture thereof, may be employed. For the group IV-VI compound, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; or a quaternary compound selected from SnPbSSe, SnPbSeTe, SnPbSTe, and a mixture thereof, may be employed. For the IV group element, Si, Ge, or a mixture thereof may be selected. For the IV group compound, a binary compound selected from SiC, SiGe, and a mixture thereof may be employed.

In this case, the binary compound, the ternary compound, or the quaternary compound may exist in a uniform concentration or in a partially different concentration in particles. The quantum dot may include multiple quantum dots, and the quantum dots may have a core/shell structure in which one quantum dot surrounds another quantum dot. An interface between a core and a shell may have a concentration gradient such that a concentration of an element in the shell decreases toward a center thereof.

The quantum dot may have a full width at half maximum (FWHM) of the light-emitting wavelength spectrum that is equal to or less than about 45 nm, preferably equal to or less than about 40 nm, and more preferably equal to or less than about 30 nm, and in this range, color purity or color reproducibility may be improved. In addition, since light emitted through the quantum dot is emitted in all directions, a viewing angle of light may be improved.

The quantum dot is not specifically limited to have shapes that are generally used in the technical field related to the present disclosure, and more specifically, may have a shape such as a nano-particle having a spherical shape, a pyramid shape, a multi-arm shape, or a cubic shape, or may be a nanotube, a nanowire, a nanofiber, a planar nano-particle, etc.

The phosphor for emitting red light may include at least one of (Ca, Sr, Ba)S, (Ca, Sr, Ba)$_2$Si$_5$N$_8$, CaAlSiN$_3$, CaMoO$_4$, and Eu$_2$Si$_5$N$_8$, but is not limited thereto.

The phosphor for emitting green light may include at least one of yttrium aluminum garnet (YAG), (Ca, Sr, Ba)$_2$SiO$_4$, SrGa$_2$S$_4$, barium magnesium aluminate (BAM), α-SiAlON, β-SiAlON, Ca$_3$Sc$_2$Si$_3$O$_{12}$, Tb$_3$Al$_5$O$_{12}$, BaSiO$_4$, CaAlSiON, and (Sr$_{1-x}$Ba$_x$)Si$_2$O$_2$N$_2$. The second color conversion layer 330G may include at least one kind of phosphor for emitting the green light. In this case, x may be any number between 0 and 1.

The transmission layer 330B may allow incident light to pass therethrough. The transmission layer 330B may allow blue light to pass therethrough. The transmission layer 330B may be formed of a polymer material that allows blue light supplied from the light unit 500 to pass therethrough. The transmission layer 330B positioned in a region for emitting blue light emits introduced blue light at it is without a separate phosphor or quantum dot.

The transmission layer 330B may include a scatterer 332. The scatterer 332 may scatter light introduced into the transmission layer 330B so as to increase an amount of light emitted from the transmission layer 330B or make front luminance and side luminance uniform.

Although not illustrated, at least one of the first color conversion layer 330R and the second color conversion layer 330G may further include a scatterer in order to scatter incident light. For example, the scatterer 332 may include at least one of TiO$_2$, Al$_2$O$_3$, and SiO$_2$, but is not limited thereto.

The transmission layer 330B may further include at least one of a blue pigment and a dye. The blue pigment and the dye may absorb at least one of red light and green light included in external light to thereby prevent color reproducibility deterioration.

A capping layer 340 may be disposed between the first color conversion layer 330R, the second color conversion layer 330G, the transmission layer 330B, and the liquid crystal layer 3.

The capping layer 340 may prevent the first color conversion layer 330R, the second color conversion layer 330G, and the transmission layer 330B from being damaged in processes after the first color conversion layer 330R, the second color conversion layer 330G, and the transmission layer 330B are formed. The semiconductor nanocrystals included in the first color conversion layer 330R and the second color conversion layer 330G may be damaged or quenched by moisture and high-temperature processes. The capping layer 340 may prevent this problem.

An optical filter layer 350 may be disposed between the capping layer 340 and the liquid crystal layer 3. The optical filter layer 350 may improve light efficiency by reflecting light generated from the first color conversion layer 330R and the second color conversion layer 330G.

The optical filter layer 350 may include a plurality of optical filter layers, and the optical filter layers may have a structure in which layers having different refractive indexes are alternately arranged along a direction substantially perpendicular to the substrate 310. The optical filter layer 350 formed by alternately arranging the layers having different refractive indexes may include a multi-layer structure of about 10 to 20 layers, but it is not limited thereto.

The optical filter layer 350 may have a structure in which a silicon oxide (SiO$_x$) film and a silicon nitride (SiN$_y$) film are alternately arranged, but it is not limited thereto. Alternatively, a titanium oxide, a tantalum oxide, a hafnium oxide, or a zirconium oxide may be used as an example of a material having a relatively high refractive index, and SiCOz may be used as an example of a material having a relatively low refractive index. In SiO$_x$, SiN$_y$, SiCO$_z$, x, y, and z as factors determining the chemical composition ratio may be controlled depending on process conditions when forming the layers.

At least one of the capping layer 340 and the optical filter layer 350 may be omitted depending on an exemplary embodiment. Particularly, when a layer closest to the capping layer 340 among the layers constituting the optical filter layer 350 is formed of a silicon nitride film, the capping layer 340 may be omitted.

A planarization layer 360 may be disposed between the optical filter layer 350 and the liquid crystal layer 3. The planarization layer 360 may serve to planarize a surface of a constituent element disposed between the planarization layer 360 and the substrate 310.

A second polarization layer 22 may be disposed between the planarization layer 360 and the liquid crystal layer 3. The second polarization layer 22 serves to polarize light passing through the light unit 500, the display panel 100, and the liquid crystal layer 3.

The second polarization layer 22 may include an applied polarization layer, a coated polarization layer, a wire grid polarizer, or the like.

The second polarization layer 22 may include a first layer 22a, a second layer 22b, and a third layer 22c, and the first layer 22a and the third layer 22c may be omitted according to an exemplary embodiment. The first layer 22a and the third layer 22c may include an inorganic material (e.g., a silicon oxide or a silicon nitride), and the second layer 22b may include a metal material. The second layer 22b may include a plurality of nanopatterns according to an exemplary embodiment, and a width of each nanopattern may be several nanometers.

The first layer 22a and the third layer 22c may serve as layers provided for a nanoimprint process, and may be omitted according to an exemplary embodiment.

The second polarization layer 22 may include the second layer 22b which is made of a metal material, to again reflect blue light emitted from the light unit 500 toward the display panel 100 by the second layer 22b. Some of the reflected light may be introduced into the transistor. However, the display panel 100 according to the exemplary embodiment of the present inventive concept may include the blue light blocking film 230R which covers the transistor to absorb the blue light reflected in a direction of the transistor. The blue light may affect the channel layer and the like to prevent generation of a leakage current and provide a display device with improved reliability.

A common electrode 270 and a second alignment layer 21 may be sequentially disposed between the second polarization layer 22 and the liquid crystal layer 3. The common electrode 270 receiving a common voltage may generate an electric field together with the pixel electrode 191. According to a modification, the common electrode 270 may be disposed in the display panel 100. The second alignment layer 21 may include a same material as the first alignment layer 11, and may be manufactured through a same process.

The aforementioned display device may supply light with improved color purity by including the light unit 500 for supplying blue light and the color conversion layers 330R and 330G for emitting red light and green light. In addition, the second polarization layer 22 included in the color conversion panel 30 is provided with a thin thickness of several nanometers, a path through which the light passes is short, and thus distortion of the light may be minimized. In addition, blue light that may be reflected in the second polarization layer 22 and introduced into the transistor Tr may be absorbed by the blue light blocking film 230R which covers the transistor Tr, to prevent performance deterioration of the transistor.

Figure 5:
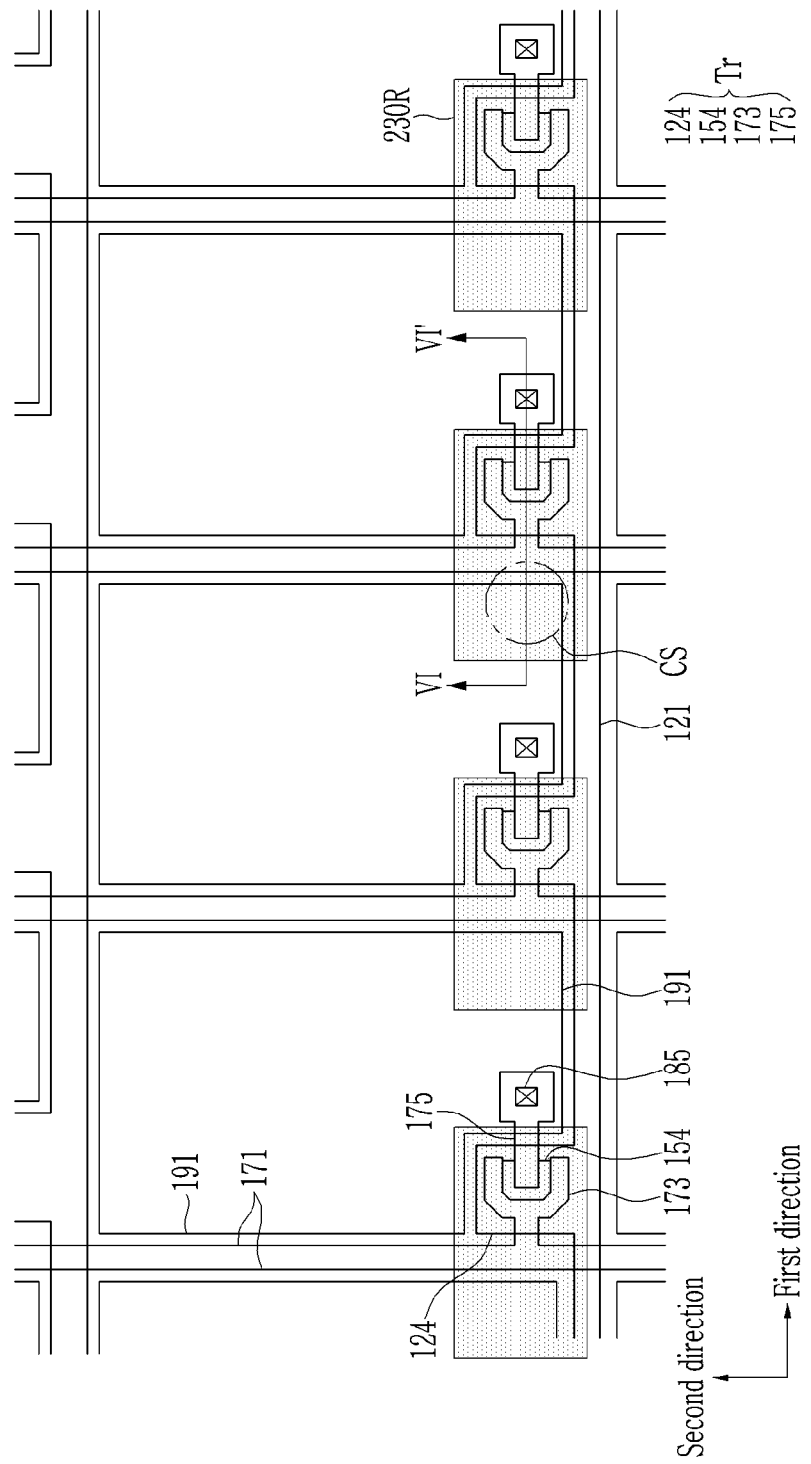
FIG. 5 is a top plan view illustrating a plurality of pixels according to an exemplary embodiment of the present inventive concept.
Figure 6:
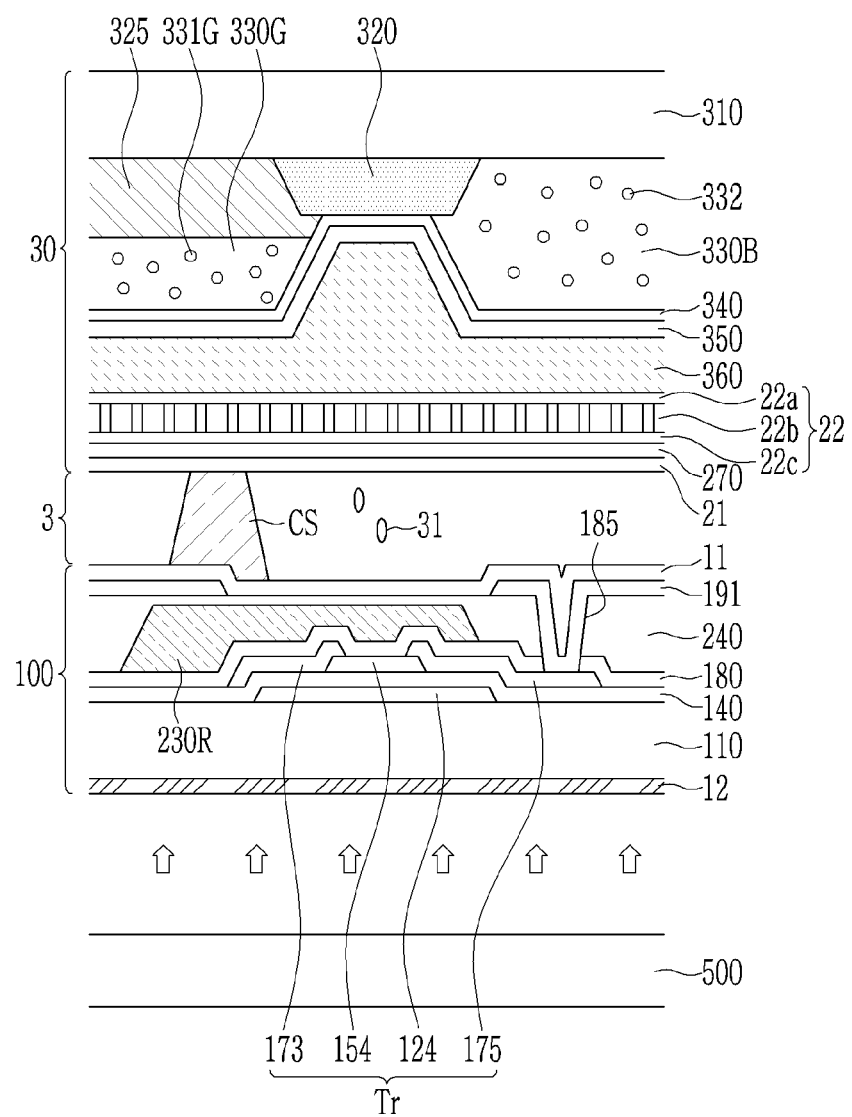
FIG. 6 is a cross-sectional view taken along a line VI-VI' of FIG. 5.

Hereinafter, a display device according to an exemplary embodiment of the present inventive concept will be described with reference to FIG. 5 to FIG. 7. FIG. 5 is a top plan view illustrating a plurality of pixels according to an exemplary embodiment of the present inventive concept, and FIG. 6 is a cross-sectional view taken along a line VI-VI' of FIG. 5. FIG. 7 is a top plan view illustrating a plurality of pixels according to an exemplary embodiment of the present inventive concept. Descriptions of the same constituent elements as those of the above-described constituent elements will be omitted below, and different configurations will be described.

First, referring to FIGS. 5 and 6, the display device according to the present exemplary embodiment may include a blue light blocking film 230R disposed on the passivation layer 180.

The blue light blocking film 230R may have an island-like shape that extends in an extending direction of the gate line 121, and may be disposed to overlap two pixels adjacent thereto. For example, as shown in FIG. 5, a right side of one blue light blocking film 230R may overlap a transistor of a first pixel, and a left side thereof may overlap a second pixel that is adjacent to the first pixel.

The blue light blocking film 230R may include a plurality of blue light blocking films 230R, which are separately disposed in the first direction as shown in FIG. 5.

An organic film 240 may be disposed on the blue light blocking film 230R. The organic film 240 may reduce steps of the display panel 100, and may prevent lifting of the constituent elements.

Next, the pixel electrode 191 and the first alignment layer 11 are sequentially disposed on the organic film 240. According to the present exemplary embodiment, the display device may further include a column spacer CS disposed on the first alignment layer 11.

The column spacer CS may include at least one of a main column spacer that is flush with a gap between the display panel 100 and the color conversion panel 30, and a sub-column spacer having a height that is smaller than that of the main column spacer.

According to the present exemplary embodiment, the column spacer CS may be overlap the blue light blocking film 230R. The blue light blocking film 230R may absorb blue light introduced into the channel layer by overlapping the transistor, and may reduce a step of a region in which the column spacer CS is positioned by overlapping the column spacer CS.

Next, referring to FIG. 7, the display device according to the present exemplary embodiment includes a blue light blocking film 230R that overlaps the transistor Tr. The blue light blocking film 230R may be disposed to overlap a region that overlaps the transistor Tr, and particularly to overlap a channel layer of the semiconductor layer 154.

According to the exemplary embodiment illustrated in FIG. 7, the display panel 100 may include the blue light blocking film 230R at a minimum, and thus may absorb blue light introduced into the transistor therethrough.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

100: display panel
30: color conversion panel
230R: blue light blocking film
330R: first color conversion layer
330G: second color conversion layer
330B: transmission layer

What is claimed is:

1. A display device comprising:
a light unit configured to emit blue light;
a color conversion panel disposed on the light unit; and
a display panel disposed between the light unit and the color conversion panel to include a transistor,
wherein the color conversion panel includes:
a substrate;
a color conversion layer disposed between the substrate and the display panel to include a semiconductor nanocrystal;
a transmission layer disposed between the substrate and the display panel; and
a polarization layer disposed between the color conversion layer and the display panel and between the transmission layer and the display panel,
wherein the display panel includes a blue light blocking film which overlaps the transistor, and the blue light blocking film includes a red color filter, and
wherein the blue light blocking film does not include a blue color filter or a green color filter.

2. The display device of claim 1, wherein the polarization layer includes:
a first layer including an inorganic material;
a second layer including a metal material; and
a third layer including an inorganic material.

3. The display device of claim 1, wherein the display panel includes a display area and a non-display area disposed around the display area,
the transistor is disposed in at least one of the display area and the non-display area, and
the blue light blocking film is disposed in at least one of the display area and the non-display area.

4. The display device of claim 1, wherein the display panel further includes:
a gate line extending in a first direction; and a data line extending in a second direction that is perpendicular to the first direction, wherein the transistor is connected to the gate line and the data line, and the blue light blocking film extends in the first direction.

5. The display device of claim 4, wherein the blue light blocking film has an island-like shape.

6. The display device of claim 4, wherein the blue light blocking film includes a plurality of blue blocking films, and the blue light blocking films are separated along the first direction.

7. The display device of claim 1, wherein the display panel further includes a column spacer, and the column spacer overlaps the blue light blocking film.

8. The display device of claim 1, wherein the light unit includes a blue light emitting diode (LED).

9. A display device comprising:

a light unit;

a color conversion panel disposed on the light unit; and a display panel comprising at least two pixels and disposed between the light unit and the color conversion panel to include a transistor, wherein the color conversion panel includes:

a substrate;

a color conversion layer disposed between the substrate and the display panel to include a semiconductor nanocrystal;

a transmission layer disposed between the substrate and the display panel; and a polarization layer disposed between the color conversion layer and the display panel and between the transmission layer and the display panel, wherein the display panel includes a blue light blocking film which overlaps the transistor and includes a contiguous portion overlapping the at least two pixels, the light unit is configured to emit light having a first wavelength that is in a range of about 400 nm to 500 nm, and the blue light blocking film is configured to absorb the light having the first wavelength.

10. The display device of claim 9, wherein the blue light blocking film is a red color filter.

11. The display device of claim 9, wherein the polarization layer includes:

a first layer including an inorganic material;

a second layer including a metal material; and a third layer including an inorganic material.

12. The display device of claim 9, wherein the display panel includes a display area and a non-display area disposed around the display area, the transistor is disposed in at least one of the display area and the non-display area, and the blue light blocking film is disposed in at least one of the display area and the non-display area.

13. The display device of claim 9, wherein the display panel further includes:

a gate line extending in a first direction; and a data line extending in a second direction that is perpendicular to the first direction, wherein the transistor is connected to the gate line and the data line, and the blue light blocking film extends in the first direction.

14. The display device of claim 13, wherein the blue light blocking film has an island-like shape.

15. The display device of claim 13, wherein the blue light blocking film includes a plurality of blue blocking films, and the blue light blocking films are separated along the first direction.

16. The display device of claim 9, wherein the display panel further includes a column spacer, and the column spacer overlaps the blue light blocking film.

17. The display device of claim 9, wherein the light unit includes a blue light emitting diode (LED).

18. The display device of claim 1, wherein the blue light blocking film directly contacts a pixel electrode.

19. The display device of claim 18, wherein the pixel electrode directly contacts the transistor through a contact hole formed in the blue light blocking film.

20. The display device of claim 7, wherein the column spacer and the blue light blocking film overlap a step.

* * * * *